United States Patent
Mochiduki et al.

(10) Patent No.: US 8,792,031 B2
(45) Date of Patent: Jul. 29, 2014

(54) SOLID-STATE IMAGE PICKUP DEVICE AND CAMERA

(75) Inventors: Katsuhisa Mochiduki, Kawasaki (JP); Takanori Suzuki, Tokyo (JP); Fujio Ito, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 748 days.

(21) Appl. No.: 13/033,376

(22) Filed: Feb. 23, 2011

(65) Prior Publication Data

US 2011/0205414 A1  Aug. 25, 2011

(30) Foreign Application Priority Data

Feb. 25, 2010  (JP) .................................. 2010-040600

(51) Int. Cl.
*H04N 3/14* (2006.01)
*H04N 5/225* (2006.01)
*H01L 21/00* (2006.01)

(52) U.S. Cl.
USPC .............................. 348/294; 348/374; 438/64

(58) Field of Classification Search
USPC .............. 348/373, 374, 294; 438/51, 64, 106; 257/678
See application file for complete search history.

(56) References Cited

U.S. PATENT DOCUMENTS

| 4,594,613 A | 6/1986 | Shinbori |
| 7,659,147 B2 * | 2/2010 | Negishi et al. ................. 438/114 |
| 2006/0087017 A1 * | 4/2006 | Chao et al. ..................... 257/680 |
| 2006/0273249 A1 * | 12/2006 | Webster et al. ................ 250/239 |

FOREIGN PATENT DOCUMENTS

| CN | 101197383 A | 6/2008 | |
| JP | 60-250667 A | 12/1985 | |
| JP | 60250667 A * | 12/1985 | .............. H01L 27/14 |
| JP | 2002-009264 A | 1/2002 | |
| JP | 2006-134998 A | 5/2006 | |
| JP | 2007-069602 A | 3/2007 | |
| JP | 2008-047878 A | 2/2008 | |

* cited by examiner

*Primary Examiner* — Nhan T Tran
(74) *Attorney, Agent, or Firm* — Canon USA, Inc. IP Division

(57) ABSTRACT

A solid-state image pickup device including: a resin package which includes a recessed section; a solid-state image pickup element disposed in the recessed section; and a cover fixed to the recessed section via a fixing member so as to cover the solid-state image pickup element, wherein: the resin package includes a substrate integrated therewith; the substrate includes a first protruding section, a second protruding section and a branched section, the first and second protruding sections protruding from a first side of the resin package, and the branched section being disposed inside the resin package and disposed between the first and second protruding sections; and an outer peripheral section of the fixing member is disposed inside an end of the branched section when seen from the direction in which light is incident.

20 Claims, 6 Drawing Sheets

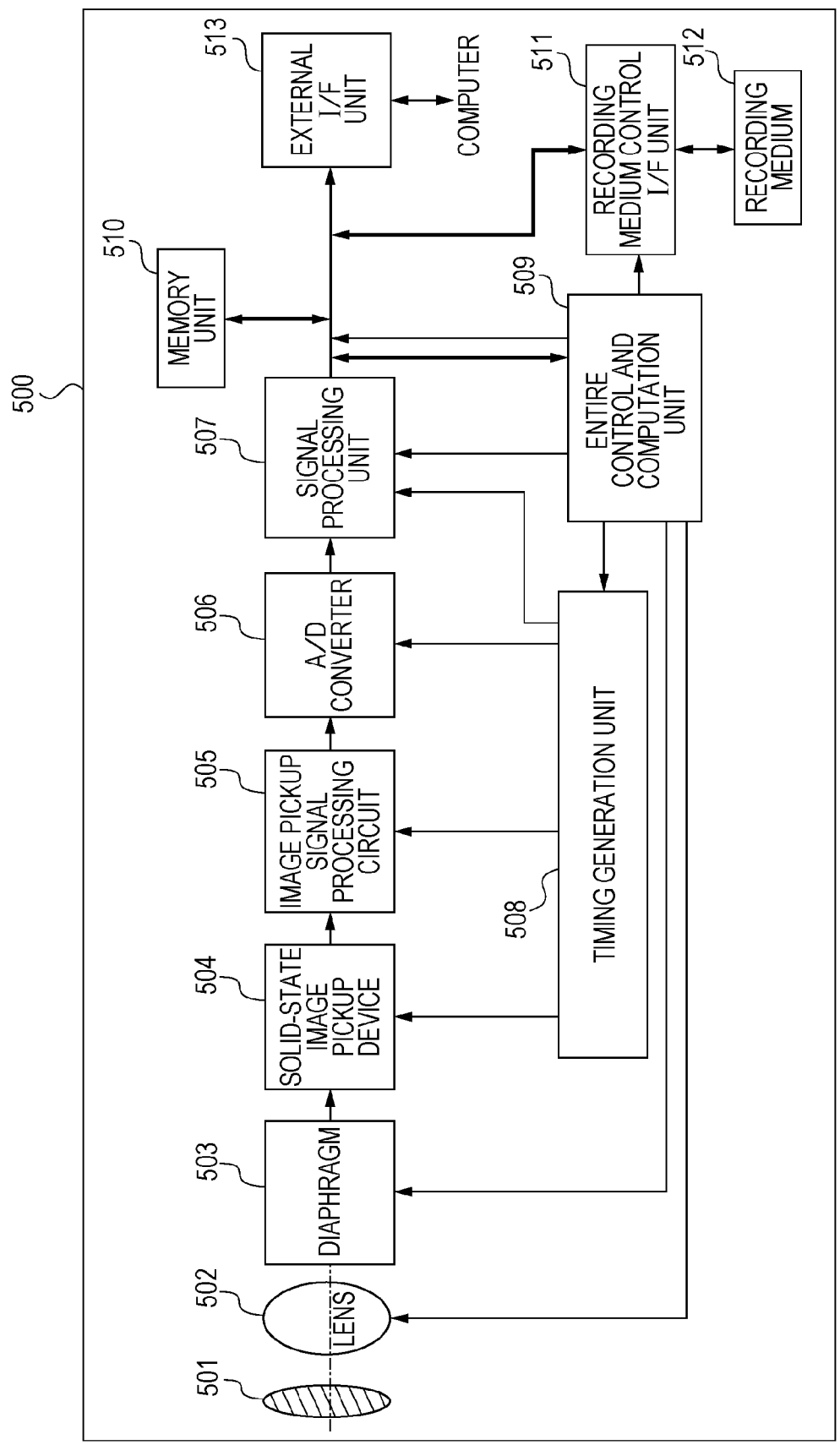

SOLID-STATE IMAGE PICKUP DEVICE AND CAMERA

BACKGROUND OF THE INVENTION

1. Field of the Invention

The present invention relates to a solid-state image pickup device incorporating an image pickup element, and to an image pickup device.

2. Description of the Related Art

Solid-state image pickup elements are acquiring increasing numbers of pixels and becoming multifunctional and more and more data is being output digitally. In response thereto, packages having such solid-state image pickup elements are acquiring an increasing number of external terminals. Some packages include an insert-molded metal sheet which provided with mounting sections with which the package is securely fixed to the inside of a still camera or a video camera. The package includes a rectangular frame section. The mounting sections of the metal sheet, which is a mounting plate, protrude from both sides of the frame section and lead frames protrude from the rest of the sides of the frame section (see Japanese Patent Laid-Open No. 2002-9264 or Japanese Patent Laid-Open No. 2006-134998).

For the injection molding of the above-described related art package, resin is injected through a resin injection port of a mold. The resin injection port should be located at a position not interfering with the metal sheet and the lead frames on side surfaces of the package. The resin injection port is located, for example, on a bottom surface of a recessed section of the package on which the solid-state image pickup element is to be rested, or on an upper surface of a periphery of the recessed section to which a transparent cover is fixed. There is a possibility that a burr, which is resin remaining after the separation of packages, is formed at the resin injection port. Such a burr affects dimensional accuracy and surface smoothness of, for example, a surface on which the solid-state image pickup element is to be rested and a surface to which the cover is to be fixed. As an alternative approach, the resin injection port may be provided above or below the metal sheet or the lead frames on the side surfaces of the package. In that case, the resin may adhere to the metal sheet to decrease accuracy as the mounting plate and the resin may adhere to the lead frames to decrease solderability. The resin injection port can be provided on the side surface of the package if the package is increased in thickness or expanded in area. However, such an increase or expansion is not acceptable in current circumstances in which more and more compact packages are required.

SUMMARY OF THE INVENTION

A solid-state image pickup device according to the present invention includes: a resin package which includes a recessed section; a solid-state image pickup element disposed in the recessed section; and a cover fixed to the recessed section via a fixing member so as to cover the solid-state image pickup element, wherein: the resin package includes a substrate integrated therewith; the substrate includes a first protruding section, a second protruding section and a branched section, the first and second protruding sections protruding from a first side of the resin package, and the branched section being disposed inside the resin package and disposed between the first and second protruding sections; and an outer peripheral section of the fixing member is disposed inside an end of the branched section when seen from the direction in which light is incident.

Further features of the present invention will become apparent from the following description of exemplary embodiments with reference to the attached drawings.

BRIEF DESCRIPTION OF THE DRAWINGS

FIG. 6 illustrates an image pickup device incorporating the solid-state image pickup device according to the embodiments.

DESCRIPTION OF THE EMBODIMENTS

Hereinafter, embodiments of the present invention will be described with reference to the drawings.

First Embodiment

A solid-state image pickup device according to the present embodiment includes a substrate protruding from a first side of a resin package. The substrate includes first and second protruding sections and a branched section disposed within the resin package. An outer peripheral section of a fixing member for fixing the resin package and a cover is disposed inside an end of the branched section of the substrate when seen from the direction in which light is incident. The solid-state image pickup device will be described in detail with reference to FIGS. 1 to 3.

Figure 1A:
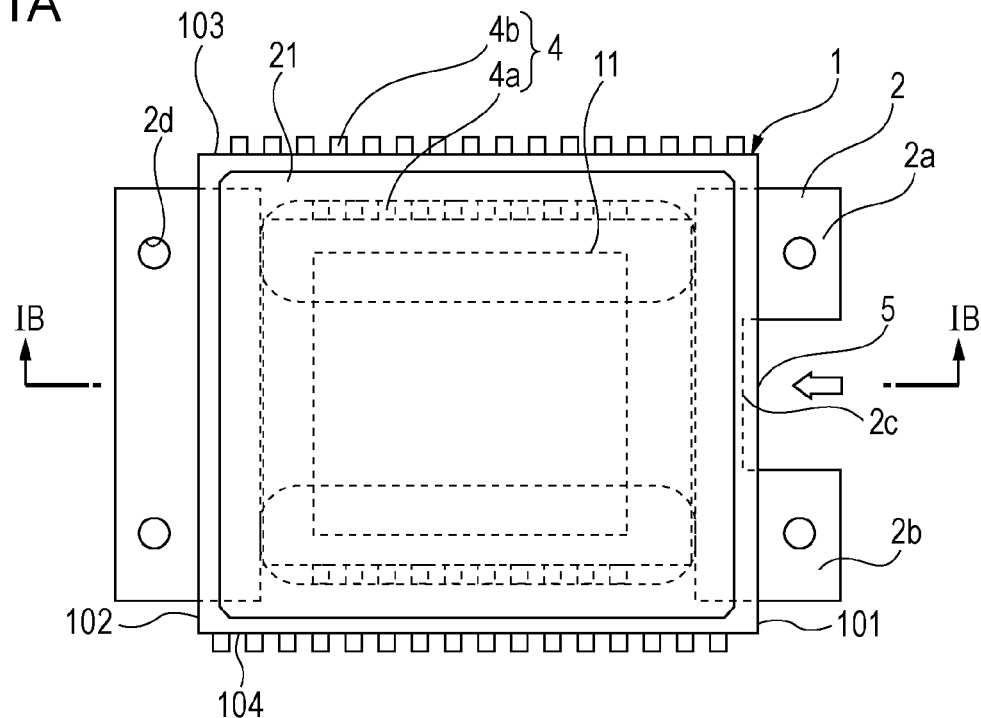
FIGS. 1A to 1C illustrate a solid-state image pickup device according to a first embodiment.
Figure 1B:
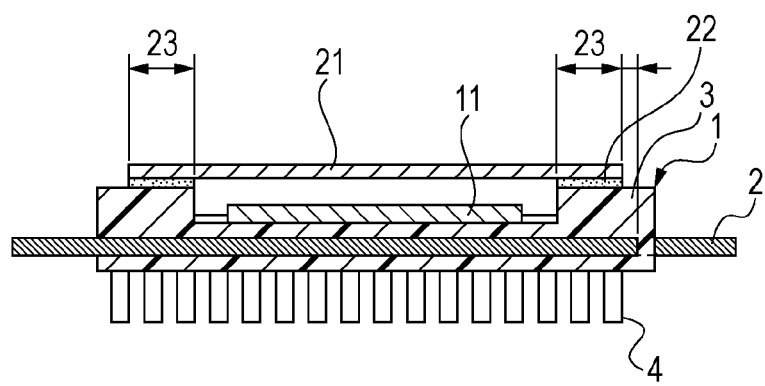
Figure 1C:
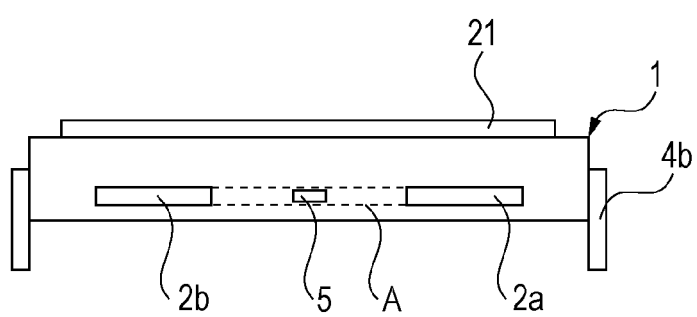
Figure 2:
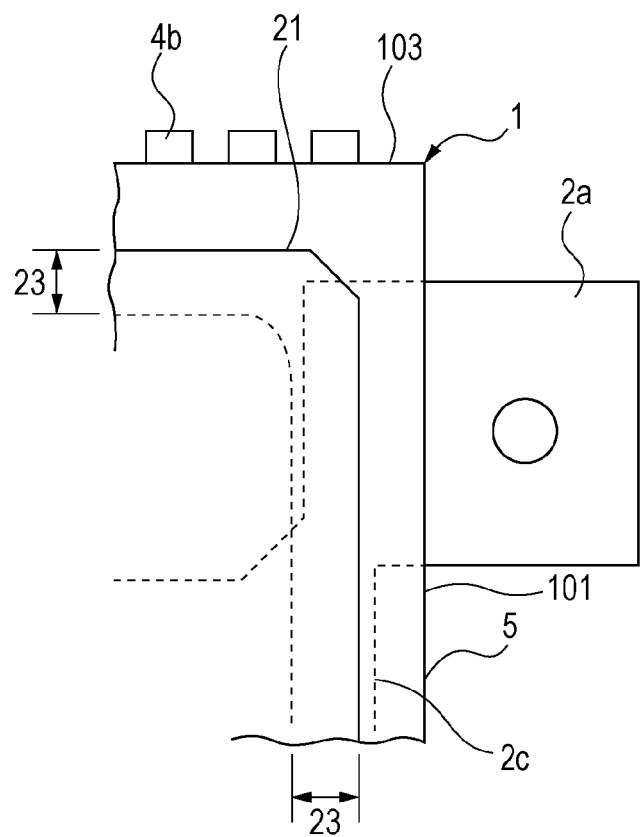
FIG. 2 illustrates the solid-state image pickup device according to the first embodiment.
Figure 3A:
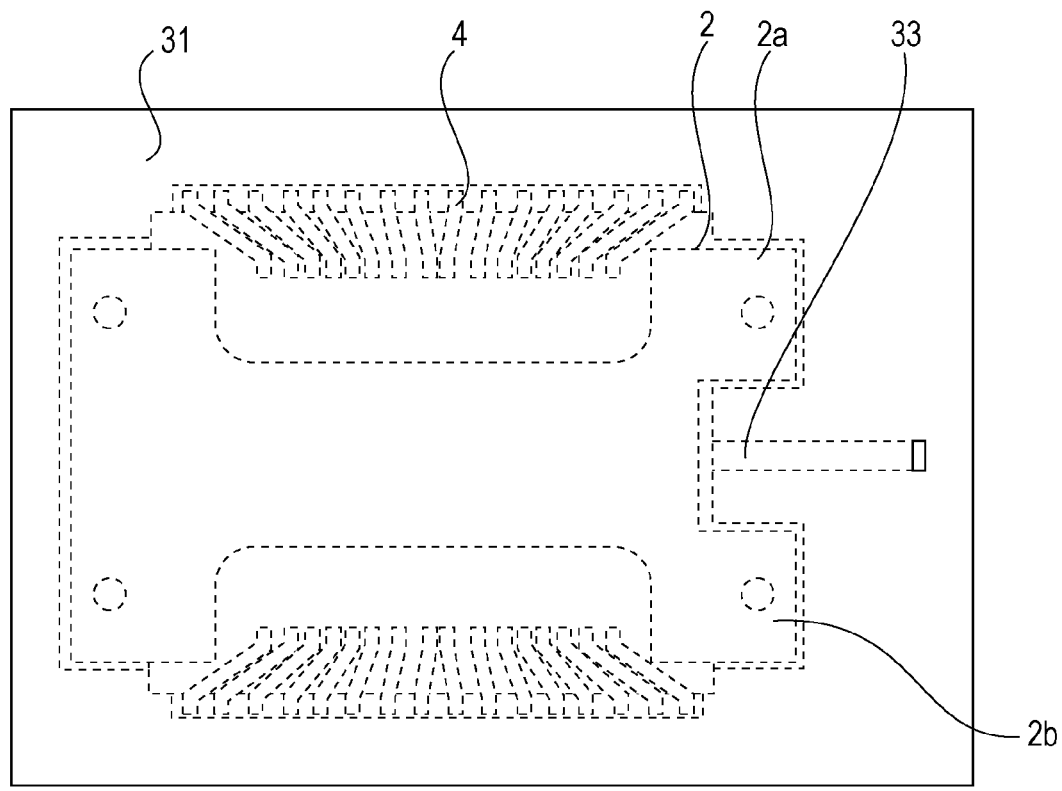
FIGS. 3A and 3B illustrate insert molding of a resin package.
Figure 3B:
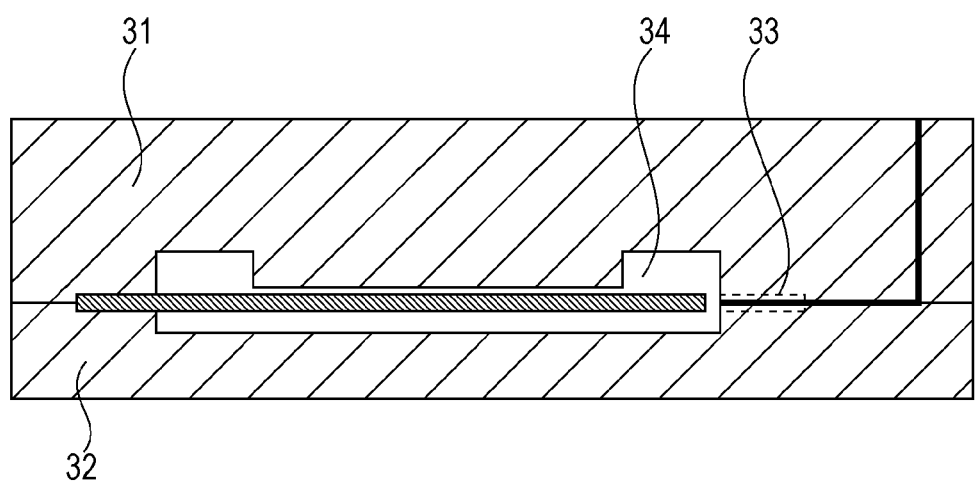

FIG. 1A is a plan view of the solid-state image pickup device according to the first embodiment. FIG. 1B is a sectional view through section IB-IB of FIG. 1A. FIG. 1C is a right side view of the solid-state image pickup device illustrated in FIG. 1A. FIG. 2 is a partially enlarged view of FIG. 1A. FIG. 3A is a plan view illustrating insert molding of a resin package. FIG. 3B is a sectional view illustrating the insert molding of the resin package illustrated in FIG. 3A.

The solid-state image pickup device illustrated in FIG. 1 includes a resin package 1, a solid-state image pickup element 11 and a cover 21. The resin package 1 includes a recessed section. The solid-state image pickup element 11 includes a plurality of photodetectors. The resin package 1 includes resin as a base material, a substrate 2 and lead frames 4, which are integrated together by insert molding. The substrate 2 includes a first protruding section 2a, a second protruding section 2b and a branched section. The first and second protruding sections 2a and 2b protrude from the right side of the solid-state image pickup device illustrated in FIG. 1A, i.e., from a first side 101 of the resin package 1. The branched section is located inside the resin package 1 and between the first and second protruding sections 2a and 2b. A protruding section is made to protrude from a left, second side 102 of the resin package 1 which is opposite to the first side 101. The lead frames 4 are provided at two opposing sides of the resin package 1. Each of the lead frames 4 includes an internal terminal 4a for the connection with the solid-state image pickup element 11 and an external terminal 4b for the connection with, for example, an external circuit board. The resin package 1 includes a third side 103 and a fourth side 104 opposing each other in a vertical direction of the solid-state image pickup device illustrated in FIG. 1A. The lead frames 4 are formed at the third and fourth sides 103 and 104. The protruding sections of the substrate 2 protrude at two sides of the resin package 1 which are different from those at which the lead frames 4 are provided. The substrate 2 also includes openings 2d at which the substrate 2 is secured to an inside of an image pickup device, such as a still camera and a video camera. The substrate 2 is made of, for example, a metal sheet of SUS or aluminum, or a ceramic sheet. Hereinafter, an exemplary solid-state image pickup device which includes the substrate 2 made of a SUS sheet will be described.

At the time of insert molding of the resin package 1, the lead frames 4 and the metal sheet are placed in a mold, into which resin is injected through a resin injection port 5 in a direction of an arrow in FIG. 1A. As illustrated in FIG. 1C, the resin injection port 5 is located at an area A between inner walls of the first and second protruding sections 2a and 2b. The thickness of the area A is within the thickness of the metal sheet 2. The area A is located at a position between upper and lower molds. Since the resin injection port 5 is provided in the area A, the insert molding can be achieved without any increase in size of the resin package 1. FIGS. 3A and 3B illustrate the insert molding in which the resin is injected into the molds from between the first and second protruding sections 2a and 2b of the metal sheet 2 which is the substrate to form the resin package 1. The metal sheet 2 and the lead frames 4 are disposed between a cavity 31 and a core 32. The resin is injected through a gate 33 into a space 34 defined between the cavity 31 and the core 32 to form the resin package 1. Upon completion of the insert molding, the resin remaining in an area between a side of the resin package 1 and the resin injection port 5 (i.e., the resin remaining in the gate 33) is removed. A burr is formed at the resin injection port 5 during the removal of the remaining resin. Since the first and second protruding sections 2a and 2b keep the burr from contact with other objects during handling of the resin package in the subsequent manufacturing processes. In one embodiment, the distance between the first and second protruding sections 2a and 2b is not smaller than 3 mm and not larger than 10 mm. If the distance is smaller than 3 mm, it is difficult to provide an injection route with sufficient flowability of the resin during injection. If the distance is larger than 10 mm, the burr easily touches other objects during handling of the resin package 1 and removes. The removed burr may drop on the solid-state image pickup element 11 to reduce the yield.

As illustrated in FIG. 1B, the cover 21 is fixed to an upper surface of a frame section 3 of the resin package 1 with a fixing member 22 which is an adhesive. Thus, the solid-state image pickup device includes a space defined by the resin package 1 and the cover 21. The solid-state image pickup element 11 is fixed to the recessed section of the resin package 1 with an adhesive (not illustrated). Thus, the solid-state image pickup element 11 is sealed by the resin package 1 and the cover 21.

The resin package 1 and the cover 21 are fixed together in a fixing area 23. As illustrated in FIGS. 1B and 2, the branched section of the metal sheet 2 is located outside an outer peripheral section of the fixing area 23 at the first side 101. That is, an end of the branched section 2c of the metal sheet 2 seen from the direction in which light is incident of the solid-state image pickup device is located outside the outer peripheral section of the fixing area 23. The metal sheet 2 is disposed below the fixing area 23 at the first side 101. In this structure, the resin package 1 and the cover 21 are reliably fixed together to provide sufficient airtightness. Thus a highly reliable solid-state image pickup device is provided.

The resin package 1 and the cover 21 are fixed together with an adhesive to seal the solid-state image pickup element 11 disposed therein. The thickness of the adhesive is designed to be small enough to reduce ingression of moisture from outside. In particular, the thickness is about 10 micrometers, and not smaller than 5 micrometers and not larger than 20 micrometers. Whether the metal sheet 2 is located or not is important. Since the thickness of the metal sheet 2 is as large as several hundreds of micrometers to several millimeters, resin shrinkage after the formation of the resin package 1 varies partially depending on the existence of the metal sheet 2. Resin shrinkage in the thickness direction of the resin package 1 is greater in an area without the metal sheet 2 than in an area with the metal sheet 2 when the solid-state image pickup device is seen from the direction in which light is incident. As a result, surface smoothness of the upper surface of the frame section 3 is decreased. In particular, the upper surface of the frame section 3 is recessed in areas without the metal plate outside the area with the metal sheet. If the fixing area 23 overlaps the recessed area, the distance between the resin package 1 and the cover 21 becomes large, in which case sufficient adhesive strength or airtightness may not be provided. It is therefore may be desirable to dispose the end of the branched section 2c of the metal sheet 2 outside the outer peripheries of the fixing area 23 of the resin package 1 and the cover 21. That is, it may be desirable to dispose the outer peripheries of the fixing area 23 of the resin package 1 and the cover 21 inside the end of the branched section 2c of the metal sheet 2.

If the distance between the first and second protruding sections 2a and 2b is narrower than the above-described range, a decrease in the surface smoothness is reduced. If the distance is larger than the above-described range, a decrease in the surface smoothness is reduced through the correction of the mold. However, the former case involves a decrease in flowability of resin and the latter case involves a decrease in strength of the metal sheet due to the restriction in an outer dimension.

As described above, the present embodiment provides a compact and highly reliable solid-state image pickup device.

Second Embodiment

Figure 4A:
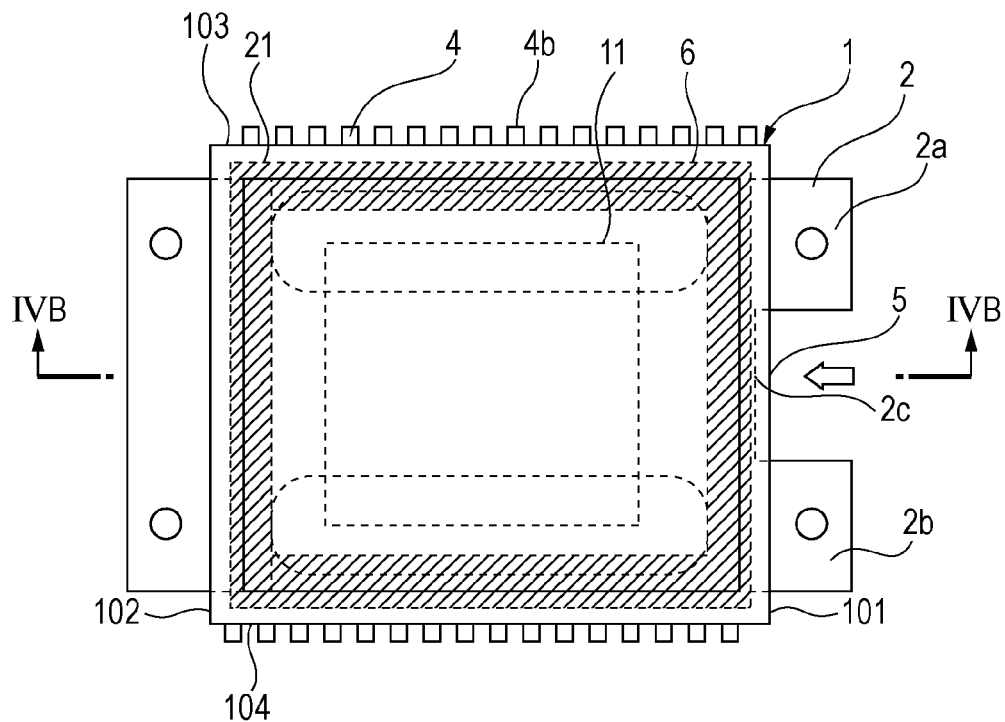
FIGS. 4A and 4B illustrate a solid-state image pickup device according to a second embodiment.
Figure 4B:
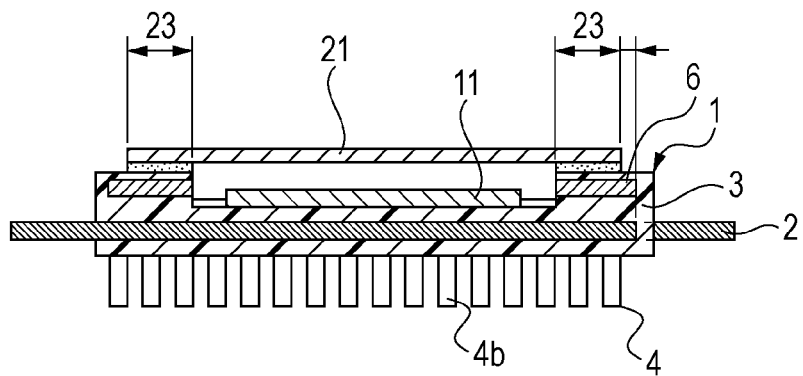
Figure 5A:
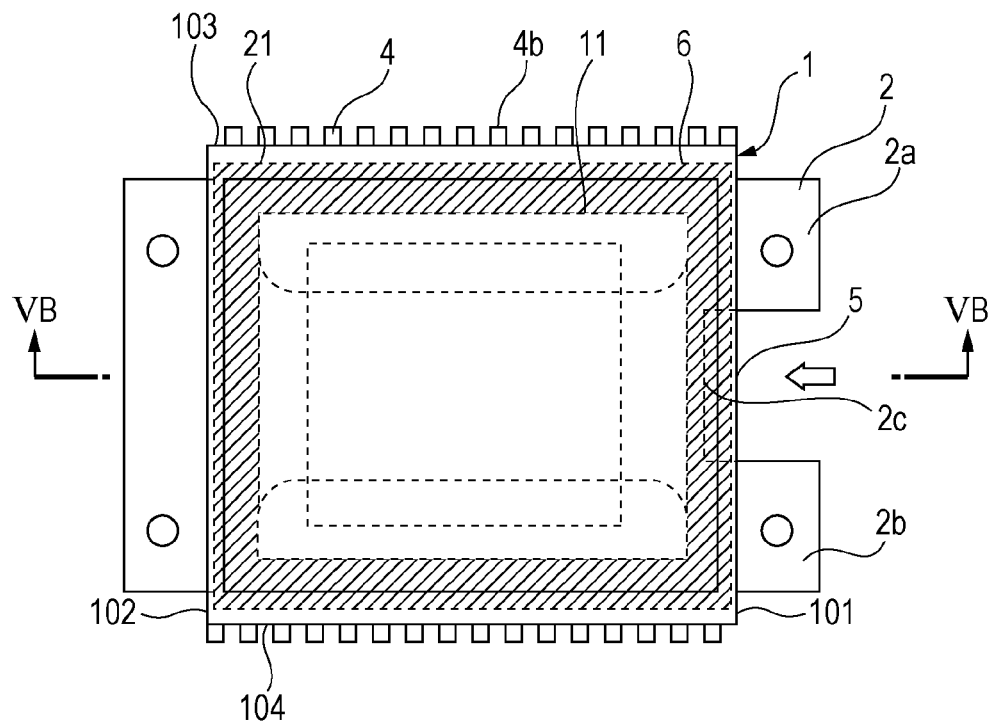
FIGS. 5A and 5B illustrate the solid-state image pickup device of the second embodiment.
Figure 5B:
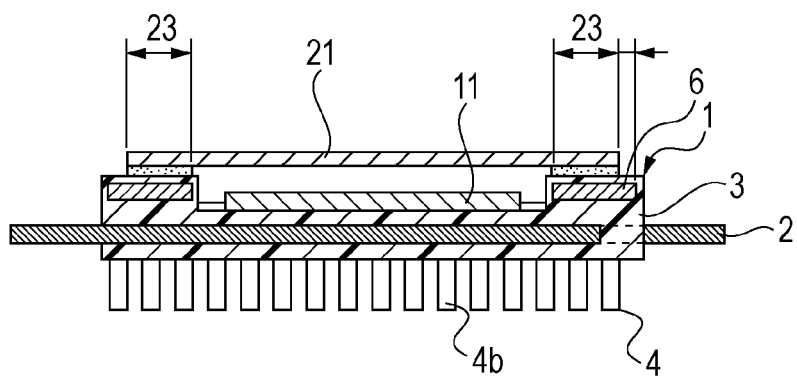

FIGS. 4A and 4B illustrate a second embodiment of the present invention. FIG. 4A is a plan view of a solid-state image pickup device. FIG. 4B is a sectional view through section IVB-IVB of FIG. 4A. FIG. 5A is a plan view illustrating a variant example of the solid-state image pickup device illustrated in FIG. 4A. FIG. 5B is a sectional view through section VB-VB of FIG. 5A.

The present embodiment differs from the solid-state image pickup device according to the first embodiment in that an additional substrate is provided in a frame section at the periphery of a recessed section of a resin package.

A resin package 1 illustrated in FIGS. 4A and 4B is formed as an integrated package by insert molding and includes resin as a base material, two metal sheets 2 and 6 as first and second substrates and lead frames 4. A metal sheet which corresponds to the metal sheet 2 of the first embodiment is referred to as a first metal sheet 2 and the additional metal sheet is referred to as a second metal sheet 6 in the present embodiment. The first metal sheet 2 and the second metal sheet 6 may be made of, for example, SUS or aluminum.

As illustrated in FIGS. 4A and 4B, the second metal sheet 6 opposes a fixing area 23 via a frame section 3 and is disposed along the entire periphery corresponding to the fixing area 23. An outer peripheral section of the second metal sheet 6 is disposed along the entire periphery of the fixing area 23 at a position outside the outer peripheral section when seen from the direction in which light is incident. Thus, surface smoothness of an upper surface of the frame section 3 of the resin package 1 to which cover 21 is fixed is kept more reliably. Thus, a compact and highly reliable solid-state image pickup device is provided.

Next, in the solid-state image pickup device illustrated in FIGS. 5A and 5B, an end of a branched section 2c of the first metal sheet 2 is located inside an outer peripheral section of the fixing area 23 when seen from the direction in which light is incident. However, surface smoothness of the upper surface of the frame section 3 of the resin package 1 to which the cover 21 is fixed is kept since the outer peripheral section of the second metal sheet 6 is located along the entire periphery of the fixing area 23 at a position outside the outer peripheral section. Since the resin injection port 5 can be located inside the resin package 1, a more compact solid-state image pickup device is provided. Accordingly, a more compact and more highly reliable solid-state image pickup device is provided.

Although the second metal sheet 6 is a frame shaped metal sheet as illustrated in FIGS. 4 and 5, the shape of the second metal sheet 6 is not limited to the same. This is because covering the branched section 2c of the first metal sheet 2 is important in keeping the surface smoothness of the upper surface of the frame section 3 at the periphery of the recessed section. Alternatively, the second metal sheet 6 may be U-shaped or bar-shaped. The second metal sheet 6 may protrude from the frame section 3 of the resin package 1. In one embodiment, the second metal sheet 6 does not protrude at the side of the lead frames 4 so as not to interfere with the soldering of external terminals 4b. If the first metal sheet 2 is used as a mounting plate to the inside of the image pickup device, a protrusion amount is to be restricted so as not to interfere with the fixation of the solid-state image pickup device to the inside of the image pickup device.

Third Embodiment

FIG. 6 illustrates a schematic structure of an image pickup device of an embodiment of the present invention. An image pickup device 500 includes a solid-state image pickup device 504 which is, for example, the solid-state image pickup device according to the embodiments described above. The solid-state image pickup device 504 may also include the image pickup elements in accordance with the embodiments described above. The image pickup device is, for example, a camera or a video camera capable of picking up still or moving images.

Functional blocks 505 to 508 may be implemented on a single chip on which the solid-state image pickup device 504 is also implemented. The functional blocks of the image pickup device 500 are controlled by an entire control and computation unit 509. The image pickup device 500 also includes a memory unit 510 for the temporary storage of image data and a recording medium control interface unit 511 for the recording and reading of the image to/from the recording medium. The recording medium 512 includes, for example, semiconductor memory and can be removed. The image pickup device 500 may be provided with an external interface unit 513 for the communication with, for example, an external computer.

Next, an operation of the image pickup device 500 illustrated in FIG. 6 will be described. As a barrier 501 is opened, a main power supply, a power supply for a control system and a power supply for an image pickup system circuit, such as an A/D converter 506, are sequentially turned on. The entire control and computation unit 509 then opens a diaphragm 503 for the control of the exposure amount. Signals output from the solid-state image pickup device 504 are supplied to the A/D converter 506 via an image pickup signal processing circuit 505. The A/D converter 506 carries out an A/D conversion of the signals and outputs the converted signals to a signal processing unit 507. The signal processing unit 507 processes the received data and provides the same to the entire control and computation unit 509, which in turn computes and determines an exposure amount. The entire control and computation unit 509 controls the diaphragm 503 in accordance with the determined exposure amount.

Next, the entire control and computation unit 509 extracts a high frequency component from the signals which are output from the solid-state image pickup device 504 and then processed in the signal processing unit 507, and computes the distance to an object in accordance with the high frequency component. Then, a lens 502 is driven and it is determined whether focus has been achieved. If the determination result is negative, the lens 502 is re-driven and the distance is computed.

After the focusing is achieved, exposure is started. After the exposure is completed, the image pickup signals output from the solid-state image pickup device 504 are, for example, corrected in the image pickup signal processing circuit 505, A/D converted in the A/D converter 506 and processed in the signal processing unit 507. The image data processed in the signal processing unit 507 is accumulated in a memory unit 510 by the entire control and computation unit 509.

The image data accumulated in the memory unit 510 is then recorded on a recording medium 512 via the recording medium control interface unit 511 under the control of the entire control and computation unit 509. The image data may be supplied to, for example, a computer via the external interface unit 513 for further processing.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-040600, filed Feb. 25, 2010 which is hereby incorporated by reference herein in its entirety.

What is claimed is:

1. A solid-state image pickup device comprising:
   a package which includes a recessed section;
   a solid-state image pickup element disposed in the recessed section; and
   a cover fixed to the package via a fixing member so as to cover the solid-state image pickup element,
   wherein:
   the package includes a resin base and a substrate for securing the solid-state image pickup device, the substrate being integrated with the resin base;
   the substrate includes a first protruding section, a second protruding section and a branched section, and a third protruding section, the first and second protruding sections protruding from a first side of the resin base, and the branched section being disposed inside the resin package and disposed between the first and second protruding sections, a third protruding section protruding from a second side of the resin base which is opposite to the first side; and the substrate has, in the third protruding section, an opening for securing the substrate, an end of the branched section is disposed inside the first side when seen from the direction in which light is incident, and an outer peripheral section of the fixing member is disposed inside the end of the branched section when seen from the direction in which light is incident.

2. The solid-state image pickup device according to claim 1, wherein a distance between the first protruding section and the second protruding section is between 3 mm and 10 mm.

3. The solid-state image pickup device according to claim 2, wherein an outer peripheral section of the fixing member is disposed outside the end of the branched section when seen from the direction in which light is incident.

4. The solid-state image pickup device according to claim 2, wherein the second substrate is a metal sheet.

5. The solid-state image pickup device according to claim 2, wherein the second substrate protrudes from the resin base at the frame section.

6. The solid-state image pickup device according to claim 1, wherein the substrate is a ceramic sheet, or a metal sheet of SUS or aluminum.

7. The solid-state image pickup device according to claim 1, wherein the resin base has a burr between the first protruding section and the second protruding section.

8. The solid-state image pickup device according to claim 1, wherein external terminals are provided at third and fourth sides of the resin base which are opposite to each other and different from the first and second sides of the resin base.

9. A camera comprising the solid-state image pickup device according to claim 1; and a signal processing section which processes signals obtained by the solid-state image pickup device.

10. The solid-state image pickup device according to claim 1, wherein a thickness of the fixing member is not smaller than 5 micrometers.

11. The solid-state image pickup device according to claim 1, wherein the package is produced by insert molding in which resin for the resin base is injected from a resin injection port between the first protruding section and the second protruding section of the substrate which are integrated together.

12. A solid-state image pickup device comprising:
a package which includes a recessed section;
a solid-state image pickup element which is disposed in the recessed section and a frame section on a periphery of the recessed section; and
a cover fixed to the frame section via a fixing member so as to cover the solid-state image pickup element,
wherein:
the package includes a resin base, a first substrate integrated with the resin base and the second substrate integrated with the resin base;
the first substrate includes a first protruding section, a second protruding section and a branched section, the first and second protruding sections protruding from a first side of the resin base, and the branched section being disposed between the first and second protruding sections, and the second substrate is disposed at the frame section so that a part of the resin base is positioned between the fixing member and the second substrate; and
an outer peripheral section of the fixing member is disposed inside an end of the second substrate when seen from the direction in which light is incident.

13. The solid-state image pickup device according to claim 12, wherein a distance between the first protruding section and the second protruding section is between 3 mm and 10 mm, and the resin base has a burr between the first protruding section and the second protruding section.

14. The solid-state image pickup device according to claim 12, wherein the first substrate is a ceramic sheet, or a metal sheet of SUS or aluminum.

15. The solid-state image pickup device according to claim 12, wherein the first substrate includes a third protruding section protruding from a second side of the resin base which is opposite to the first side, and wherein the first substrate has an opening in the third protruding section.

16. The solid-state image pickup device according to claim 12, wherein the resin base is produced by insert molding in which resin for the resin base is injected from a resin injection port between the first protruding section and the second protruding section of the substrate which are integrated together.

17. A camera comprising the solid-state image pickup device according to claim 12; and a signal processing section which processes signals obtained by the solid-state image pickup device.

18. A solid-state image pickup device comprising:
a package which includes a recessed section;
a solid-state image pickup element disposed in the recessed section; and
a cover fixed to the package via a fixing member so as to cover the solid-state image pickup element,
wherein:
the package includes a resin base and a substrate integrated with the resin base,
the substrate includes a first protruding section, a second protruding section and a branched section, the first and second protruding sections protruding from a first side of the resin base, and the branched section being disposed inside the resin package and disposed between the first and second protruding sections, and
the package is produced by insert molding in which resin for the resin base is injected from a resin injection port between the first protruding section and the second protruding section of the substrate which are integrated together.

19. The solid-state image pickup device according to claim 18, wherein the substrate is a metal sheet of SUS or aluminum, or a ceramic sheet.

20. The solid-state image pickup device according to claim 18, wherein the substrate includes a third protruding section protruding from a second side of the resin base which is opposite to the first side.

* * * * *